(12) United States Patent
Chen

(10) Patent No.: US 6,260,176 B1
(45) Date of Patent: Jul. 10, 2001

(54) METHOD AND SYSTEM FOR SIMULATING AND MAKING A PHASE LOCK LOOP CIRCUIT

(76) Inventor: Jesse Eugene Chen, 445 Pala Ave., Sunnyvale, CA (US) 94086

( * ) Notice: Subject to any disclaimer, the term of this patent is extended or adjusted under 35 U.S.C. 154(b) by 0 days.

(21) Appl. No.: 09/372,411

(22) Filed: Aug. 10, 1999

Related U.S. Application Data

(63) Continuation of application No. 08/756,368, filed on Nov. 27, 1996, now Pat. No. 5,987,238.

(51) Int. Cl.[7] .................................................. G06F 15/20
(52) U.S. Cl. .............................................. 716/1; 714/814
(58) Field of Search ................................ 714/814; 716/1

(56) References Cited

U.S. PATENT DOCUMENTS

| | | | |
|---|---|---|---|
| 4,549,262 | 10/1985 | Chung et al. | 364/200 |
| 4,876,737 | 10/1989 | Woodworth | 455/12 |
| 4,879,527 | 11/1989 | Geile et al. | 331/1 |
| 5,757,857 | 5/1998 | Buchwald | 375/271 |

OTHER PUBLICATIONS

Van Paemel, M., *Analysis of a Charge–Pump PLL: A New Model*, 8089 IEEE Transactions on Communications, vol. 42, No. 7, Jul. 1994.

Antao, B., et al., *Behavioral Modeling Phase–Locked Loops for Mixed Mode Simulation*, Analog and Integrated Circuits and Signal Processings, 10, 45–65 (1996).

Saleh, Resve A., et al., *Multilevel and Mixed–Domain Simulation of Analog Circuits and Systems*, IEEE Transactions on Computer–Aided Design of Integrated Circuits and Systems, vol. 15, No. 1, Jan. 1996.

Japanese Patent Abstract, Publication No. 07219991, Publication Date Aug. 18, 1995, Application Date Feb. 03, 1994, Application No. 06031799, Inventor: Yoshino Ryozo, Simulation Method for PLL.

Best, R.E., *Phase–Locked Loops*, Second Edition, 1993, McGraw–Hill, pp. 93–104.

Chen, J.E., "Non–Linear State Space Averaged Modeling of a Three–State Digital Phase–Frequency Detector," submitted to 1997 Current Issues in Electronic Modeling.

Connelly, J.A., et al., *Macromodeling with SPICE*, 1992, Prentice–Hall, pp. 134–165.

Demir, A., et al., "Behavioral Simulation Techniques for Phase/Delay–Locked Systems," CICC paper, May 1994.

(List continued on next page.)

*Primary Examiner*—Matthew Smith
*Assistant Examiner*—Thuan Do
(74) *Attorney, Agent, or Firm*—Lyon & Lyon LLP

(57) ABSTRACT

A method of making a phase lock loop circuit is disclosed. The method includes a method of simulating the phase lock loop circuit. The simulation runs on a system for making phase lock loop circuits. The simulation step initializes a reference frequency variable associated with a reference frequency of a phase lock loop circuit. The simulation method also initializes a voltage controlled oscillator (VCO) frequency variable associated with a VCO frequency of the phase lock loop circuit. A phase error is obtained from a frequency error between the reference frequency variable and the VCO frequency variable. The simulation method resets the phase error by a reset phase level when the phase error is approximately the same as a multiple of a reset threshold. When the frequency error changes sign, the phase error is permitted to also change sign. The simulation also determines a loop filter input for the phase lock loop circuit that depends upon the phase error and the frequency error. The simulation method provides a dramatic improvement in simulation time over conventional simulation methods.

46 Claims, 8 Drawing Sheets

OTHER PUBLICATIONS

Gardner, F.M., et al., *Phaselock Techniques*, Second Edition, 1979, Prentice–Hall, Section 5.3 Kesterson, J.W., "Relative–1Phase Modeling Speeds SPICE Simulation of Modulated Systems," Nov. 11, 1993, EDN, p. 91.

Klapper, J., et al., *Phase–Locked and Frequency–Feedback Systems*, 1972, Academic Press, pp. 76–83 Middlebrook, et al., "A General Unified Approach to Modeling Switching Converter Power Stages," 1976, IEEE Power Electronics Specialists Conference Record, IEEE Publication No. 76CH1084 AES.

Rippy, R., "Basic Program Eases Analysis of Phase–Locked Loops," Jun. 26, 1986, EDN, p. 157.

Wolaver, D.H., *Phase–Locked Loop circuit Design*, 1991, Prentice–Hall, pp. 61–64, 171–173.

Couch II, Leon, W., *Digital and Analog Communication Systems*, 1993, pp. 289–297.

METHOD AND SYSTEM FOR SIMULATING AND MAKING A PHASE LOCK LOOP CIRCUIT

RELATED APPLICATION

This application is a continuation application of U.S. patent application Ser. No. 08/756,368, filed on Nov. 27, 1996, now U.S. Pat. No. 5,987,238, which is incorporated by reference herein in its entirety.

BACKGROUND OF THE INVENTION

The present invention relates generally to making electrical circuits and more particularly to simulating phase lock loop circuits.

A phase lock loop is a feedback loop that forces a voltage controlled oscillator (VCO) to run in phase with a reference signal. For example, a frequency synthesizer application of a phase lock loop can generate a frequency that is a multiple of a reference frequency. Typically, a high frequency is generated from a low reference frequency. Phase lock loop circuits are used extensively in communication systems. They can be found, for example, in vertical hold and horizontal hold circuits and color controls in televisions FIG. 1 is block diagram illustrating how a phase frequency detector 208 fits into a phase lock loop circuit 200. Those skilled in the art will appreciate that there is a correspondence between the blocks in FIG. 1 and the function of physical circuit components and connections. As modeled in FIG. 1, a reference signal source 202 inputs a reference signal with reference frequency VREF into the phase lock loop circuit 200. The reference signal source can be any of a panoply of sources including incoming data lines or radio signals having underlying carrier frequencies. The phase lock loop 200 locks onto the reference signal having frequency VREF.

A voltage controlled oscillator (VCO) 204 produces a signal having a VCO frequency. In some situations, it will be convenient to have a 1/N divider 206 in the phase lock loop 200. The 1/N divider 206 divides a frequency of the VCO 200 output by the number N. The divider 206 is particularly useful, for example, when the VCO 204 generates a high frequency carrier signal for a radio transmission, and the phase lock loop 200 checks the high frequency carrier against a low frequency VREF signal. The divider 206 produces a divided VCO signal with frequency VVCO which feeds back into a phase frequency detector 208. In other implementations of the present invention, the 1/N divider 206 is absent, and the output of the voltage controlled oscillator 204 feeds directly into the phase frequency detector 208. In many situations, the divider 206 can easily be modeled by a simple gain block.

The phase frequency detector 208 receives a reference frequency signal and a VCO frequency signal. The reference frequency variable is VREF. The outputs of the phase frequency detector 208 is essentially a loop filter input. The loop filter 210 strips the loop filter input of ripple and outputs the VCO input voltage to the VCO 204.

The phase frequency detector 208 contains a digital state machine with states corresponding to loop filter inputs. The loop filter input is a charge pump having three states corresponding to a current source, a current sink, and current off. A state of the digital state machine is assigned one of the three states. The duty cycle refers to a relative time spent in a state of the digital state machine. This concept will be illustrated graphical by using a vector representation of the digital state machine.

In FIG. 2A, the current source state 212 is on top, and the current sink state 214 is on the bottom. The current off state 216 is between the current source state 212 and the current sink state 214. The percentage of time spent in the top (or bottom) state is the duty cycle. The duty cycle is positive for top-middle toggling and negative for middle-bottom toggling. The duty cycle is "unlocked" when the phase lock loop 200 has not locked onto the reference frequency VREF.

In FIG. 2B, vector 218 represents a reference phase, and vector 220 represents a VCO phase. Both vectors 218 and 220 rotate counter-clockwise around an origin. Vector 218 rotates with frequency VREF, and vector 220 rotates with the frequency VVCO. An angle θ between the vectors 218 and 220 equals phase error. The phase error is standardized to lie between +2 Pi and −2 Pi. Whenever the reference vector 218 passes a trigger line 222, such as a vertical line, the state jumps to the next state up in FIG. 2A. If the phase frequency detector 208 has output already in the (top) current source state 212, it stays there. Whenever the VCO vector 220 passes the trigger line 222, the state jumps to the next state down. If the phase frequency detector 208 output is already in the (bottom) current sink state 214, it stays there.

If reference and VCO frequencies are essentially identical, the phase error is nearly constant as the vectors 218 and 220 rotate. For a fixed phase error, the state toggles between two states as the vectors 218 and 220 rotate. The state toggles between the (middle) current off state 216 and the (top) current source state 212 or between the (middle) current off state 216 and the (bottom) current sink state 214.

Although the phase frequency detector 208 output current toggles between values, the loop filter 210 and VCO 204 respond to a percentage of time the digital state machine (phase frequency detector output) is in one of the two states, i.e. the duty cycle. At zero frequency error, the duty cycle equals phase error divided by 2*Pi. A transfer curve from phase error to duty cycle is resembles a multivalued sawtooth.

If reference and VCO frequency variables have a large difference, the average duty cycle becomes a monotonic function of a frequency ratio of the reference frequency and the VCO frequency. Suppose the reference frequency far exceeds the VCO frequency. Whenever the VCO vector 220 passes the trigger line 222, the reference vector 218 passes shortly thereafter. The reference vector 218 may pass the trigger line 222 several more times before the VCO vector 220 passes the trigger line 222 again. The phase error still resembles a sawtooth waveform but an average duty cycle is nearly 1. Although this is an accurate statement of phase lock loop function, conventional phase models (described below) are unable to simulate on a computer average duty cycles close to 1.

Phase lock loops having phase frequency detectors 208 are traditionally very difficult to simulate. Important goals of a phase lock loop simulation are to determine how long a VCO 204 takes to lock onto the reference signal and what frequencies and phase the VCO 204 produces as it approaches the reference frequency. The VCO frequency is usually several orders of magnitude greater than the bandwidth of the loop. Consequently, to study loop dynamics a simulation may need to cover thousands to millions of oscillator periods.

Two kinds of conventional phase lock loop models exist: voltage and phase. Voltage models simulate each cycle of action. Consequently, simulated voltages correspond to voltages one could measure in a circuit. Voltage models have long run times but can simulate large-signal transients, i.e. deviations about a lock frequency as the phase lock loop 200 settles into the lock frequency. Voltage models are extremely slow because they must simulate every cycle of action. Therefore, they can easily take days to simulate the millions of cycles occurring in one transient as phase lock is approached. Conventionally, only voltage models can simulate large signal transients.

"Phase model" refers to modeling the voltage-controlled oscillator (VCO) as just an integrator. Phase models run hundreds to thousands of times faster than voltage models. Non-linear phase models exist but only for simple phase detectors such as XOR gates or analog multipliers. The phase model for an analog multiplier for example simply models input to the loop filter as the sine of phase error; the model has no memory (does not depend upon previous inputs), is single-valued, and is easily modeled with a single line in a behavioral source.

Conventional phase frequency detector models of phase lock loop circuits are either linear or conceptual. Linear models ignore important mode changes. Conceptual models are too difficult to implement with any simulator. The modeling complexity comes from focusing on phase error and duty cycle. These conceptual models integrate reference frequency and VCO frequency to get reference phase and VCO phase. They then compute the phase error and the duty cycle.

In the conceptual models, a transfer curve from the phase error to the duty cycle is a sawtooth "waveform" with odd symmetry. For monotonic excursions in phase error away from the origin, the transfer curve lies in the upper half plane. The curve lies in the lower half plane for negative monotonic phase error excursions. Changes in direction along a phase error axis can produce hysteresis. When phase error changes direction to go negative, the duty cycle should cross zero at the nearest multiple of 2 Pi then becomes a sawtooth in the lower (or upper) half plane. The conventional phase models cannot simulate this behavior in a practical computation scheme that runs on a computer, and they cannot simulate transitions to frequency or phase lock.

SUMMARY OF THE INVENTION

The present invention is directed to a method of making an electrical circuit having a phase lock loop circuit. The method includes a step of providing design specifications for the electrical circuit containing the phase lock loop circuit. The method selects a candidate wiring for routing the circuit and selects component values compatible with said candidate topology for components part of the circuit. The method also includes simulating performance of the phase lock loop circuit to obtain a loop filter input. The method ascertains whether the loop filter input is compatible with the design specifications.

The simulation of the phase lock loop circuit associates a reference frequency variable with a reference frequency of the phase lock loop circuit. A voltage controlled oscillator (VCO) frequency variable is associated with a VCO frequency of the phase lock loop circuit. The method of simulating obtains a phase error from a frequency error between the reference frequency variable and the VCO frequency variable. The simulation method resets the phase error to a reset phase level when the phase error is approximately the same as a multiple of a reset threshold. When the frequency error changes sign, the phase error is permitted to also change sign. The method also has a step of determining a loop filter input for the phase lock loop circuit that depends upon the phase error.

In an article of manufacture embodiment, the simulation method is on a computer readable medium such as a floppy disk, CD-ROM, magnetic tape, hard disk, RAM, ROM, etc. The computer readable medium includes program instructions for performing steps for the method of simulating the phase lock loop circuit on a computer.

In an apparatus aspect of the invention, a system for making phase lock loop circuits is disclosed. The system includes a digital hardware description processor including a central processing unit (CPU), digital storage coupled to the CPU, and a user input device coupled to the CPU operable to create candidate electrical circuit wiring topologies and associated mask data from design specifications for a circuit received via the user input device. The design specifications include a reference frequency for the phase lock loop circuit. The hardware description processor determines candidate specifications including a duty cycle. The hardware description processor also compares the design specifications with the candidate specifications and stores the associated mask data for the candidate electrical circuit wiring topologies on the digital storage. The invention apparatus also includes a mask generator coupled to the digital storage for making at least one circuit mask from the associated mask data stored in the digital storage.

The invention method can simulate long, large-signal transients, such as pull-in transients, approximately 2500 times faster than previous methods. Previous models are either very hard if not impossible to implement, or extremely slow. The slow models labor over each phase frequency detector output pulse and are thus impractical. Transients simulated with previous models contain ripple. Ripple is often not of interest. The invention method simulates the essential large-signal transients without laboring over ripple.

DETAILED DESCRIPTION OF PREFERRED EMBODIMENTS

The present invention does not affect how a phase lock loop circuit operates but simulates operation of the phase lock loop circuit 200. Because simulation is used in making and testing electrical circuits having phase lock loops, there are methods of making and testing phase lock loop circuits also associated with the simulation method. The simulation method uses a new model of the phase frequency detector 208 to simulate operation of the phase lock loop 200.

Several operations or steps are described below as performed on a "computer." Those skilled in the art will appreciate that although it may be convenient to perform multiple steps on one processor or central processing unit (C.P.U.), the invention does not require it. Indeed, it may be advantageous to perform some steps on one processor or C.P.U. and other steps on one or more other processors or C.P.U.'s. Therefore, the term computer should be construed to include multiple processors and C.P.U.'s which may be electrically or electromagnetically connected via one or more networks as well as those not connected as in multiple stand alone machines. Of course, data can be transferred between stand alone machines by floppy disks, tapes, CD-ROMS, etc.

An input to a loop filter 210 is an output of a phase frequency detector 208. However, the loop filter 210 essentially does not respond to ripple in the output of the phase frequency detector 208. Since the ripple is sometimes of little interest, the identification below of the loop filter input with low ripple expressions should not be construed as a limitation of the present invention. In addition, since the loop filter input is directly proportional to a duty cycle, steps in computing the loop filter input have a correspondence with steps in computing the duty cycle The present invention addresses large transients that last a long time, not ripple. Conventional voltage models address ripple but take a very long time to simulate large transients, unlike the present invention. There are no practical non-linear conventional phase models of phase frequency detectors.

Figure 1:
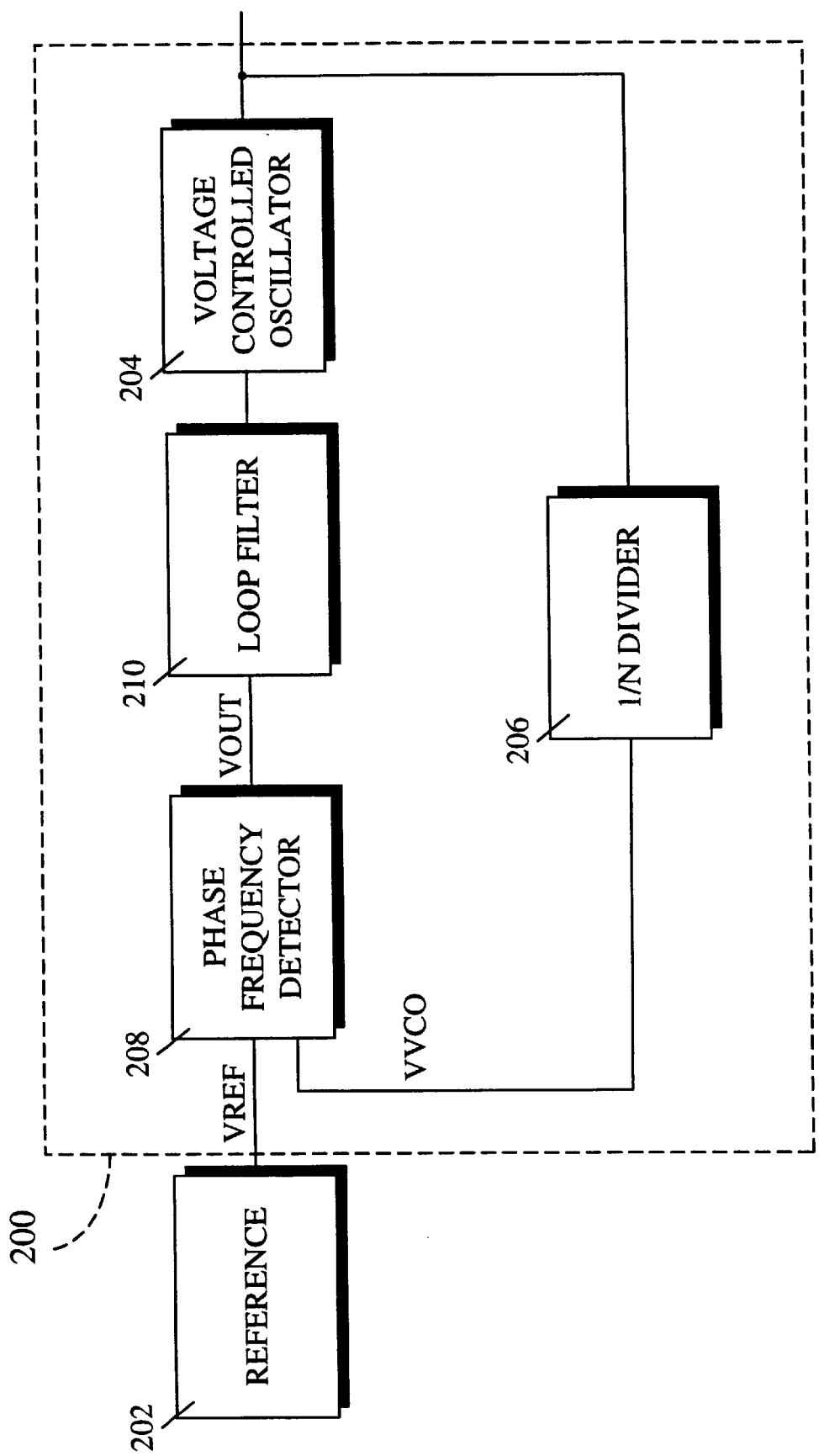
FIG. 1 is a diagrammatic representation of a conventional phase lock loop circuit having a phase frequency detector.
Figure 2B:
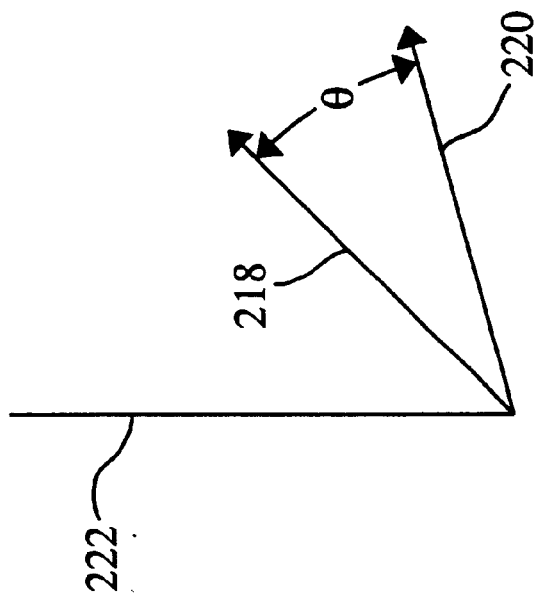
FIGS. 2A–2B are a diagrammatic representation of a conventional digital state machine.
Figure 2A:
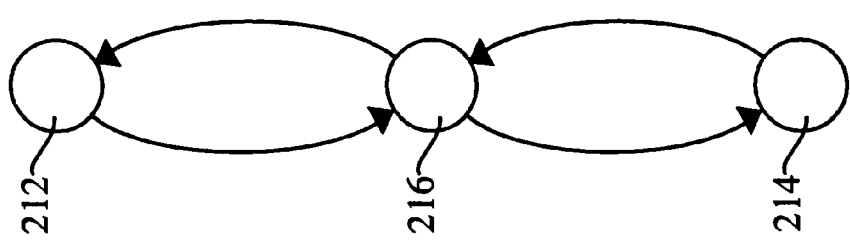
Figure 3A:
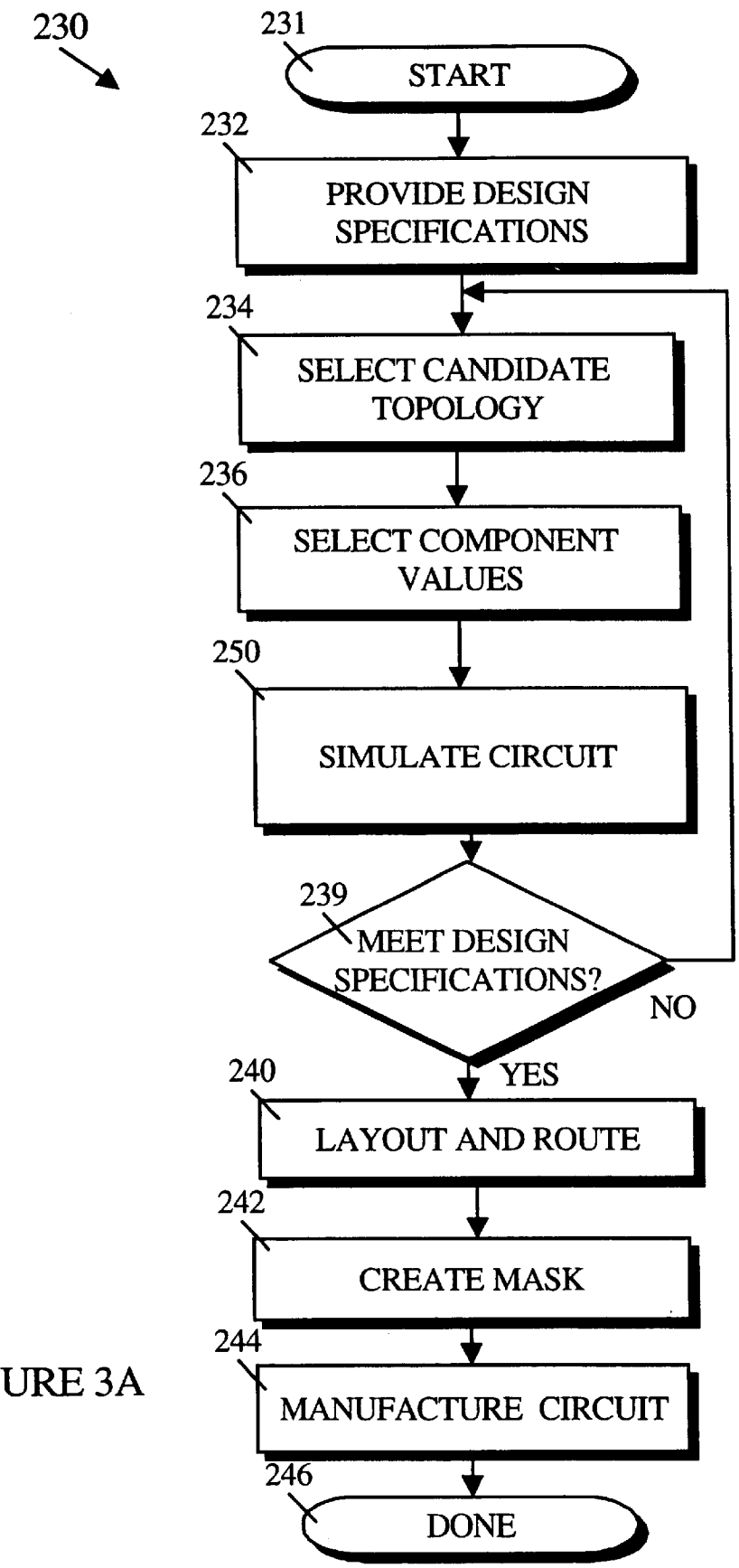
FIG. 3A is a flow diagram illustrating an embodiment of a method of making a phase lock loop circuit in accordance with the present invention.

FIG. 3A is a flow diagram showing an overview of a preferred invention method 230 of making an electrical circuit containing a phase lock loop 200 beginning with a step 231. For ease of discussion, the electrical circuit will be assumed to be an integrated circuit. Step 232 provides design specifications for a proposed integrated circuit. Design specifications can include a type of circuit to be constructed, timing requirements, power limitations, noise levels, temperature range, size requirements, and functional requirements such as restrictions on input to the loop filter 210. The design specifications are preferably in a hardware description language (HDL) used by a computer. Of course, other computer representations of the design specifications in other languages are possible.

Step 234 selects a candidate circuit wiring topology to implement the design specifications. Component values for the candidate circuit wiring topology are selected in step 236. Examples of component values are resistances, capacitances, inductances, etc. As with other electrical circuits, it is desirable to simulate performance of the phase lock loop circuit 200 before production. Circuit simulations are performed in step 250. Step 239 ascertains whether the component values in the arrangement of the candidate circuit wiring topology meet the design specifications for the circuit based on results of the simulating step 250. If the design specifications are not met, control is returned to step 234 which selects a new candidate circuit wiring topology, and step 236 selects corresponding new component values. Circuit simulations are performed for the new candidate circuit wiring topology and new component values in step 300.

Once step 239 determines that the design specifications are met, layout and routing of the circuit is performed in step 240. The layout and routing includes specific information for implementing the circuit wiring topology selected in step 234. For example, step 239 specifies how connections are made between layers in the integrated circuit to form the components making up the phase lock loop 200 and integrated circuit. Step 242 creates a mask from layout information provided by step 240. The mask may be used in photolithography to form the circuit on a printed circuit board or on a photosensitive substrate used in the integrated circuit The integrated circuit is produced in step 244 using the mask. The method 230 ends at a step 246.

The simulation method 250 of the present invention focuses on a frequency error and the duty cycle or loop filter input regardless of operational mode. For small frequency errors, the duty cycle is indeed proportional to the phase error. The phase error is an integral with respect time of the frequency error. The duty cycle therefore equals the integral of the frequency error divided by 2*Pi. The present invention method can simulate average duty cycles near 1 by replacing the phase error by a retarded phase error defined below.

Figure 3B:
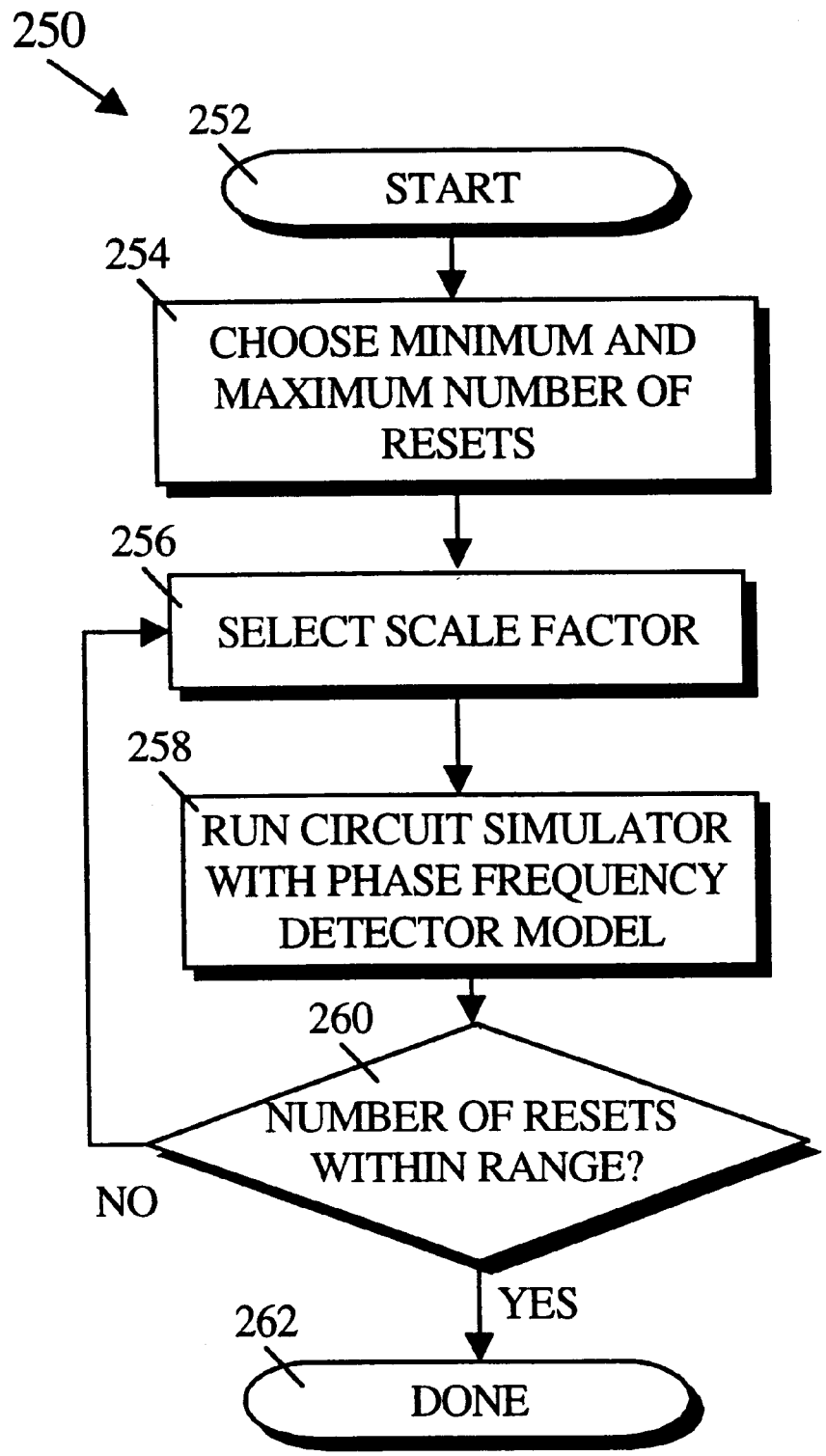
FIG. 3B is a flow diagram illustrating an embodiment of a method of simulating a phase lock loop circuit in accordance with the present invention.

FIG. 3B is a flow diagram of an overview of an embodiment of the method 250 of simulating a phase lock loop circuit 200 in accordance with the present invention beginning at a step 302. The method 250 is performed on a computer. The method 250 can be embodied as a computer program on a computer readable medium such as a floppy disk, CD-ROM, magnetic tape, hard disk, RAM, ROM, etc.

The method 250 begins at a step 252. The method 250 runs a simulation of the phase lock loop 200 where the simulation includes a phase frequency detector model. The phase frequency detector model defines a retarded phase error which is reset as the phase lock loop 200 transitions to phase lock. Step 254 chooses minimum and maximum numbers of resets to occur during the running of the phase frequency detector model. Together, the minimum and maximum resets define a specified range for the number of resets.

Step 256 selects a scale factor used in computing a weighting function and a retarded phase error below. The scale factor is selected to provide sufficient detail in the duty cycle and corresponding loop filter input computed in step 320 below. When the scale factor is too large, too few resets appear in the loop filter input and not enough detail of the phase lock loop operation is simulated. When the scale factor is too small, too many resets occur in the loop filter input to permit reasonable simulation times. Essentially, the scale factor is chosen to make the number of resets lie within the specified range derived in step 254. Preferred values of the scale factor depend on a response time of the phase lock loop 200, time scale of interest for the simulation method 250, and desired accuracy. By specifying a range of allowed resets, the method 250 balances accuracy versus speed.

Step 258 runs a circuit simulator including a phase frequency detector model of the present invention to determine a duty cycle and loop filter input. Differential and/or integral equations for voltages or currents can be solved by the simulator using the loop filter input as a circuit parameter in a nodal analysis of the phase lock loop 200. Acceptable circuit simulators include versions of SPICE and Spectre-HDL™ incorporating the phase frequency detector model of the present invention. By performing fast, detailed computations of the loop filter input and duty cycle, the present invention permits detailed knowledge of VCO frequencies as the phase lock loop 200 slews to lock. For example, parametric VCO models can be used with the phase frequency detector model of the present invention to determine phase lock loop behavior as a function of VCO model parameters. Because conventional models are extremely slow, conventional models are not practical for performing such parametric analysis.

Step 260 checks whether the number of resets occurring in step 258 is within the specified range. If the number of resets is within the specified range, the simulation method 250 ends in step 262. If the number of resets is outside of the specified range, the simulation method 250 returns to step 256 where a new scale factor is selected.

The scale factor selected in step 256 in the preferred embodiment above adjusts the weighting factor. For best results the retarded phase error (computed below) should reset several times before the loop 200 enters frequency lock. Once a new scale factor is selected in step 256, step 258 is repeated until step 260 determines that the number of resets is within the specified range. A couple of trial runs to optimize the weighting function of the preferred embodiment takes only a few minutes. The method of simulation 250 ends in a step 262.

Figure 4:
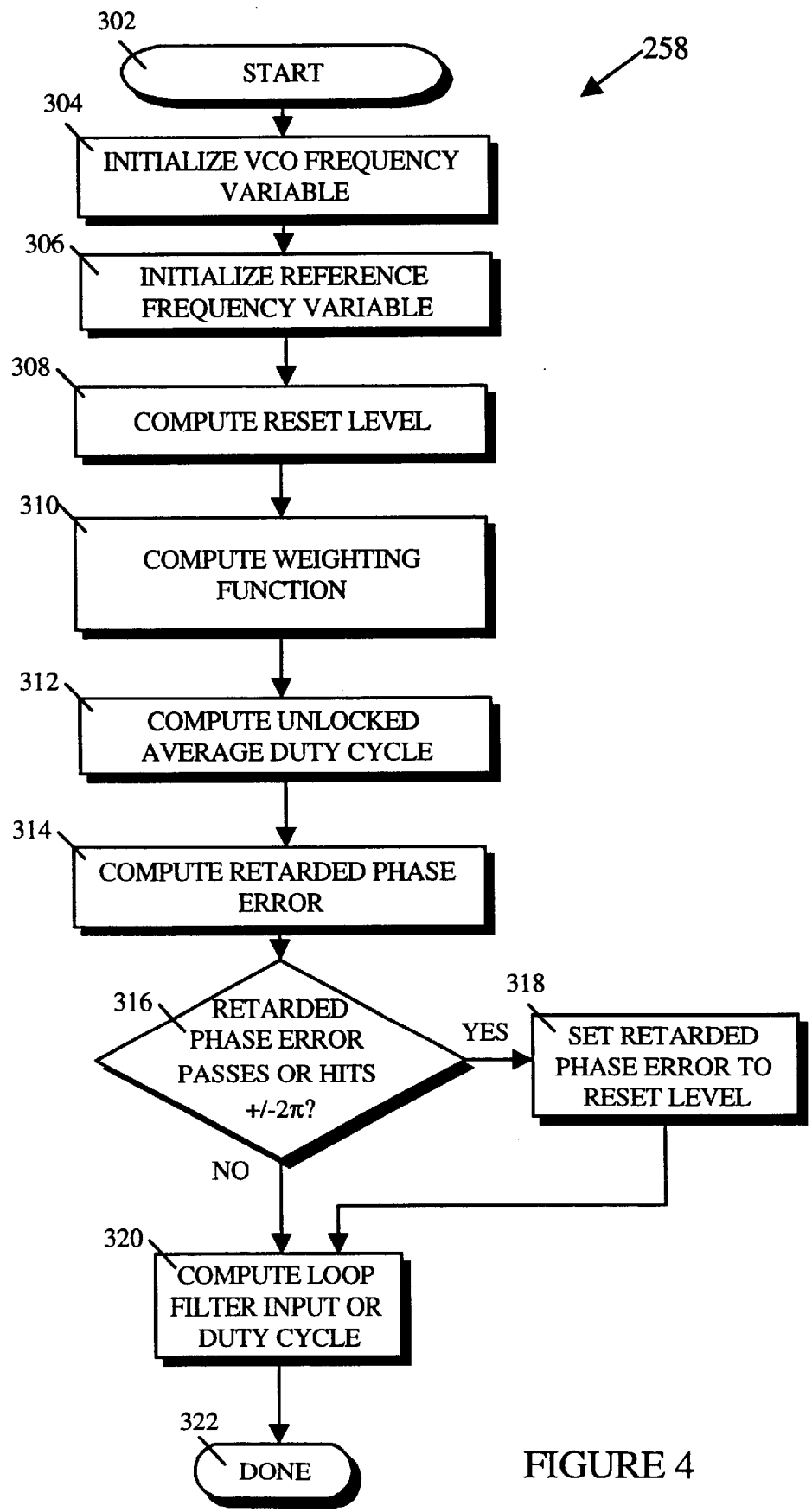
FIG. 4 is a flow diagram illustrating an embodiment of a method of simulating a phase frequency detector circuit in accordance with the present invention.

FIG. 4 is a flow diagram illustrating step 258 of running the circuit simulator in more detail beginning at a step 302. Step 302 is broached for every time increment in the circuit simulator. A reference frequency variable XREF and a VCO frequency variable XVCO are associated with inputs to the phase frequency detector 208. Step 304 initializes the VCO frequency variable. Step 304 may read in or use a preset default value of the VCO frequency variable. Generally, the VCO frequency variable will change as the simulation 300 runs on a computer. If the 1/N divider 206 is absent, the VCO frequency variable is merely the VCO frequency. With the divider 206 in the phase lock loop circuit 200, the VCO frequency variable is the VCO frequency divided by N. In some applications, N may be replaced by an effective N which is not an integer. Step 306 initializes the reference frequency variable to VREF. Step 306 may read a value for the reference frequency variable or use a default value. As a practical matter, when using a computer, both the VCO frequency variable and the reference frequency variable have minimum bounds to prevent division by zero when either frequency in the phase lock loop 200 is zero.

The present invention resets a retarded phase error (defined below) when the retarded phase error approaches a reset threshold. Henceforth, the reset threshold will be assumed to be +2 Pi or −2 Pi although other reset thresholds may be used. The retarded phase error is reset to a reset level when the retarded phase error approaches the reset threshold. In preferred embodiments, the reset level depends upon a ratio of the reference frequency variable and the VCO frequency variable. Presently, the following reset level is preferred:

reset level=2*Pi*tanh[2.2*ln(XREF/XVCO)]

where ln is the natural logarithm function, and tanh is the hyperbolic tangent function. In this preferred embodiment, the reset level approaches +2 Pi and −2 Pi as the frequency ratio approaches infinity and zero, and the reset level approaches zero as the frequency ratio approaches one. Essentially, the factor of 2.2 controls how quickly the reset level transitions from −2 Pi to zero to +2 Pi as the frequency ratio varies from zero through unity to infinity.

The precise form of the reset level is not crucial to the present invention. For example, another reset level having similar behavior to the explicit expression above would also be compatible with the simulation method 300.

Step 310 computes a weighting function used in combining the unlocked average duty cycle and retarded phase error to form the loop filter input. Presently, the weighting function is preferred to be:

weighting function=ABS{(tanh[(scale factor)*ln(XREF/XVCO)]}

This preferred weighting function takes values between zero and one. The weighting function will be used below in step 314.

Step 312 computes an unlocked average duty cycle. For a sustained frequency error, conventional simulations only use phase error and predict an average duty cycle of +½ or −½ regardless of a size of the frequency error. This is correct only for small frequency errors. An actual average duty cycle approaches either +1 or −1 for large frequency errors. The present invention approximates the unlocked average duty cycle as a function of the ratio of the reference frequency variable to the VCO frequency variable. A presently preferred embodiment sets unlocked average duty cycle={[SGN(reset level)+(reset level)]/(2*Pi)}/2 where SGN(reset level) is the sign of the reset level. Thus, using the expression for the reset level above, as the ratio of XREF to XVCO approaches zero, the reset level approaches −2*Pi, and the unlocked average duty cycle approaches −1. Similarly, as the ratio of XREF to XVCO approaches (positive) infinity, the reset level approaches +2*Pi, and the unlocked average duty cycle approaches +1. For the frequency ratio near 1, the unlocked average duty cycle is near ½.

Step 314 computes the retarded phase error as a time integral of a weighted difference between the VCO frequency variable and the reference frequency variable as shown below. When the frequency difference is large, an unretarded phase error would reset continually. This would be a serious problem causing significant and unnecessary losses in computational speed. To prevent this, the integrand of the retarded phase error is weighted to be small when the frequency difference is large. In a preferred embodiment, the weighting factor under the integral is one minus the weighting function described above:

integrand weighting factor=(1−(weighting function))

The integrand weighting factor multiplies the difference between the VCO frequency variable and the reference frequency variable thus minimizing computations of the retarded phase error integral when the frequency ratio approaches plus or minus infinity. Therefore, retarded phase error=∫dt[(1−(weighting function))(XREF−XVCO)]

where dt is a time increment indicating a numerical integration with respect to time. The integrand weighting factor is generally very desirable in practical situations.

It is emphasized that resetting the retarded phase error integral whenever it hits a multiple of +2 Pi or −2 Pi produces a curve resembling a multivalued sawtooth waveform. If the frequency error (difference) changes sign, the retarded phase error ramps to zero, passes through zero, and generates a curve resembling a sawtooth in the lower half plane. A plot of the resulting retarded phase error vs. duty cycle resembles a multivalued sawtooth.

Step 316 queries whether the retarded phase error has "passed" or approximately equals the reset threshold. The retarded phase error is considered to have passed the reset threshold when it is greater than the rest threshold plus a specified tolerance. Similarly, the retarded phase error is assumed to approximately equal the reset threshold when it is within a range of values between the reset threshold minus a the specified tolerance and the reset threshold plus the specified tolerance. If step 316 answers yes, the retarded phase integral is reset in step 318 to the reset level defined above. Then step 320 computes the loop filter input or, equivalently, the duty cycle. This is effectively the output of the phase frequency detector 208 that is passed to the loop filter 210. If step 316 determines that the retarded phase integral is less than the reset threshold minus the specified tolerance, method 300 passes control to step 320 without resetting the retarded phase error.

Step 320 combines the retarded phase error and the average unlocked duty cycle to form the loop filter input below:

loop filter input=[(1−weighting function)*(retarded phase error)/(2*Pi)+(unlocked average duty cycle)*(weighting function)]*[maximum charge pump current]

Where the weighting function is designated as "k", the unlocked average duty cycle is designated as "H", the maximum charge pump current is designed as "$i_{max}$", the measured frequency error is designated "$f_{ERROR}$" and is defined as the difference between the reference frequency variable "$X_{REF}$" and VCO frequency variable "$X_{VCO}$" (both of which have been described previously herein), and the retarded phase error is given by the integral appearing several paragraphs above, then the loop filter input may be mathematically rewritten as:

loop filter input=[(k·H)+(1−k)·§$_R$(1−k)(F$_{ERROR}$/2π)]·$i_{MAX}$

In the above equation, the operator "§$_R$" indicated that the integration of the retarded phase error is reset periodically when it passes or is approximately equal to the reset threshold, as described previously herein.
The loop filter input is the duty cycle multiplied by a maximum charge pump current. Essentially, the duty cycle (loop filter input) is written as a convex sum of the retarded phase error divided by 2*Pi and the unlocked average duty cycle. The average of the retarded phase error divided by 2*Pi is the unlocked average duty cycle. The weighted sum therefore gives the correct average loop filter input when the phase lock loop 200 is unlocked or locked. The method of simulation 300 ends in a step 322.

Figure 5:
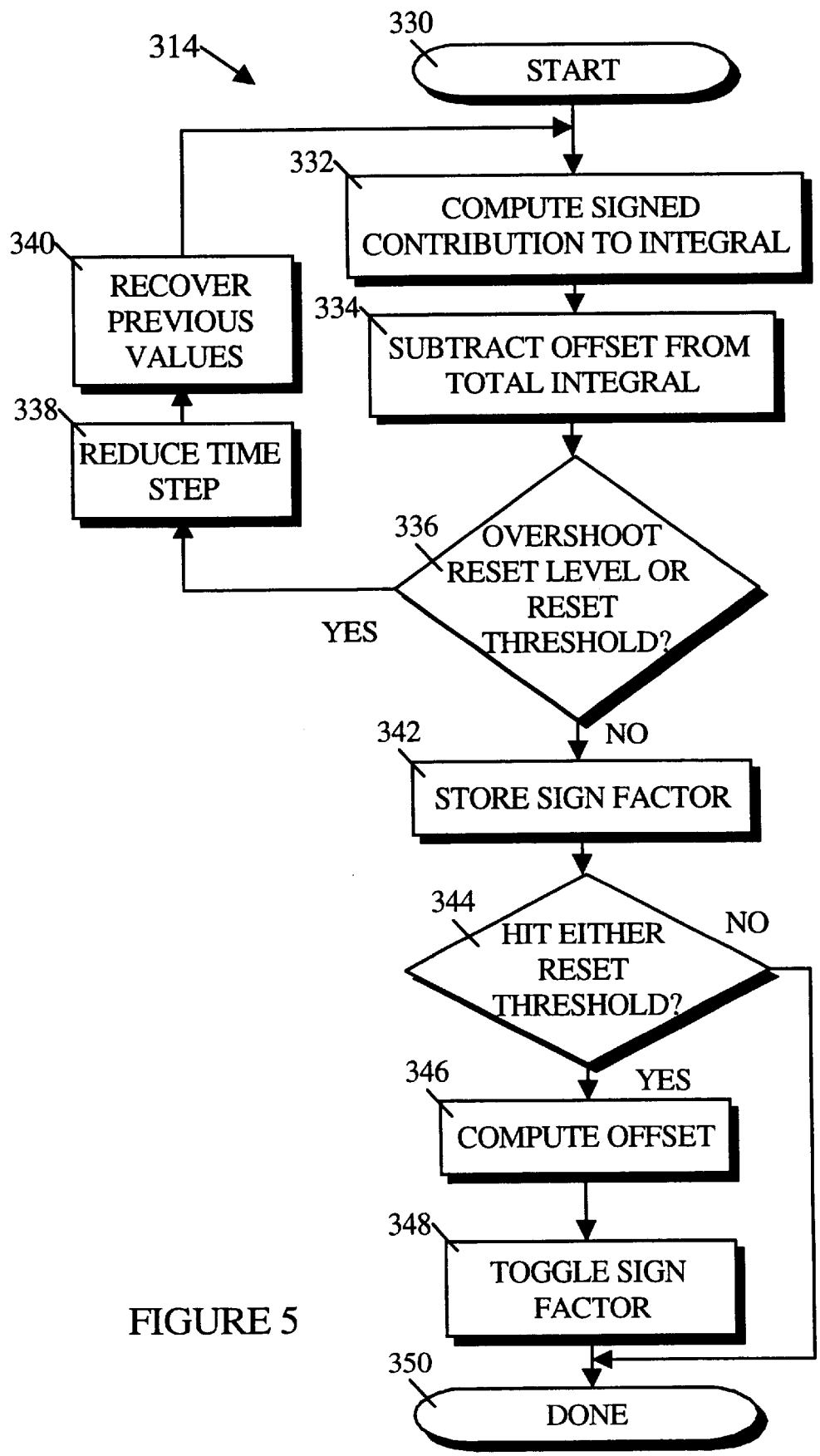
FIG. 5 is a flow diagram illustrating an embodiment of a step of FIG. 4 of computing a retarded phase error integral in accordance with the present invention

A more detailed description of a presently preferred embodiment of the step 314 of computing the retarded phase integral will now be presented with reference to FIG. 5 beginning at a step 330. Step 314 is traversed for each time step in a phase lock loop simulation 300. Step 332 computes a signed contribution to the retarded phase error integral. In a numerical computation, step 332 computes the weighted difference in VCO and reference frequency variables multiplied by a time increment for the integral and adds the result to any previously calculated contributions to the integral. Step 334 subtracts an offset from the integral. If step 334 is traversed for the first time in FIG. 5, the offset is zero. Since the offset computed below depends upon the reference frequency variable and the VCO frequency variable, the value of the offset will change with time.

Step 336 determines whether the integral resulting from step 334 "overshoots" either a reset level or the reset threshold such as +2*Pi or −2*Pi. As with the offset, the reset level changes with time as the VCO and reference frequency variables change. The integral "overshoots" the reset level when it is greater than the reset level plus a tolerance. Similarly, the integral "overshoots" the reset threshold when the integral is greater than the reset threshold plus another tolerance. For simplicity these two tolerances can be equal and equated to the specified tolerance defined above. When the reset level is hit, the retarded phase error is reset. If the integral overshoots either point, the simulation time increment must be reduced in step 338 to prevent the overshoot. To overshoot either, the integral must lie outside a specified tolerance of either. Variable values and values of the integral prior to steps 332 and 334 are recovered in step 340. Steps 332, 334, and 336 are repeated with successively smaller time increments until step 336 determines that neither overshoot has occurred.

Step 342 stores a sign factor. The sign factor keeps the retarded phase error between the positive and negative thresholds. For the first time increment, the sign factor is one. The sign factor is also used to ensure the correct sign of contributions to the retarded phase error, to the offset calculated below, and the loop filter input.

Step 344 queries whether the retarded phase error integral is within a tolerance of the reset threshold, i.e. whether the retarded phase error approximately equals multiples of −2*Pi or +2*Pi in the preferred embodiment. If so, a new offset is computed in step 346 for use in step 334 in the next time increment. In a preferred embodiment, the offset equals the retarded phase error calculated through the current time increment plus the sign factor multiplied by the reset level:

offset=(retarded phase error)+(sign factor)*(reset level)

Essentially, setting the offset in this way and subtracting it from the retarded phase error for the next time increment shifts every other tooth of the duty cycle sawtooth into the opposite half plane until the retarded phase error once again approximately equals a next multiple of the reset threshold.

Then step 348 toggles the sign factor to the negative of its previous values, i.e. +1 becomes −1 and vice versa. The sign factor is toggled for computations to take place in the next time increment. Any remaining computations for the current time increment requiring the sign factor will use the value stored in step 342. For example, in some embodiments, the sign factor multiplies the retarded phase error in step 320 when computing the loop filter input.

Step 314 illustrated in FIG. 5 ends in a step 350. Step 344 passes control of method 300 to step 350 directly if the integral is not within a tolerance of a multiple of the reset threshold.

Figure 6A:
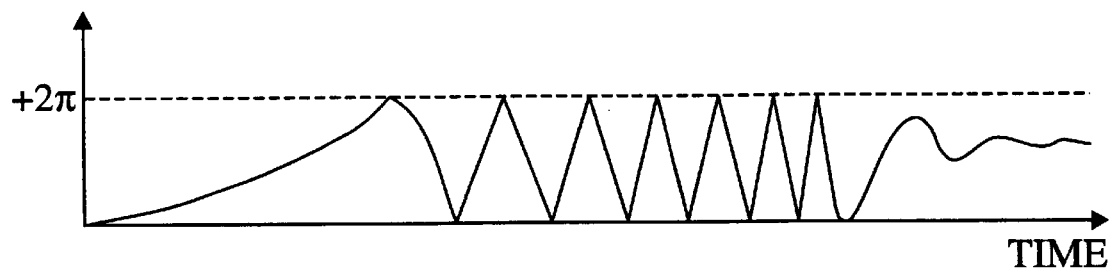
FIGS. 6A–6D are graphs illustrating an embodiment of simulating phase lock loop in accordance with the present invention.
Figure 6B:
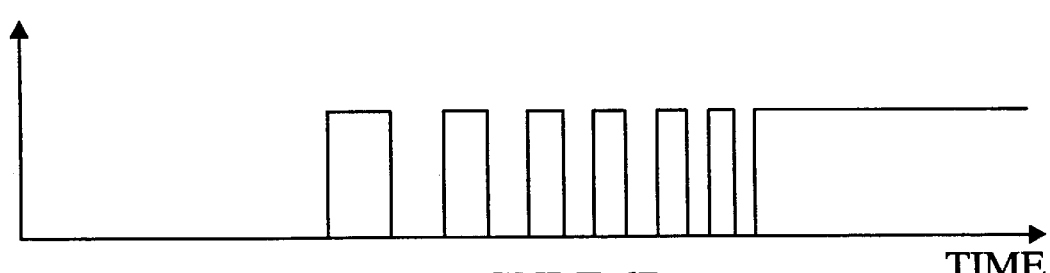
Figure 6C:
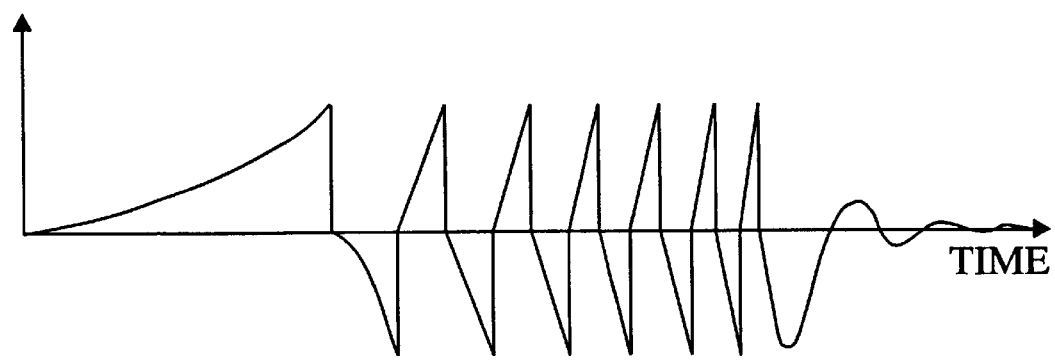

FIGS. 6A–D show sample curves corresponding to various computations in the method 300. FIG. 6A is a graph of a retarded phase error integral versus time. The retarded phase error lies between the reset threshold of 2*Pi and −2*Pi. FIG. 6B is a graph of the corresponding offset as a function of time. The offset is non-zero when the retarded phase error in FIG. 6A is decreasing. The retarded phase error integral in FIG. 6A minus the corresponding offset curve in FIG. 6B as performed in step 334 results in the curve in FIG. 6C.

Figure 6D:
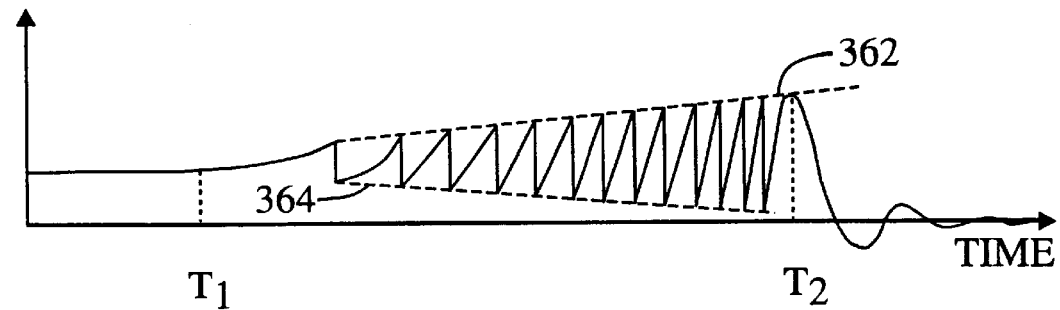

FIG. 6D is the resulting duty cycle (loop filter input) computed in step 320 of the preferred embodiment above. For small times, roughly less than $T_1$, the duty cycle is approximately the unlocked average duty cycle because the weighting factor functions essentially nullify the contribution from the retarded phase error integral.

As time increases, roughly between $T_1$, and $T_2$, the duty cycle transitions to the retarded phase error term. During the transition, the duty cycle has jagged peaks and valleys as the retarded phase error resets. An upper envelope 362 for the duty cycle in the transition region is roughly given by (weighting function)*(average unlocked duty cycle)+reset threshold*(1−(weighting function))

A lower envelope 364 of the duty cycle in the transition region is roughly given by (weighting function)*(average unlocked duty cycle)+reset level*(1−(weighting function))

The scale factor determines the number of times a duty cycle resets during the transition.

For times greater than roughly $T_2$, as phase lock is approached, the contribution from the average unlocked duty cycle becomes negligible, and the duty cycle is approximately proportional to the retarded phase integral. Then, the retarding factors under the time integral determining the retarded phase error and the function of the weighting function multiplying the time integral both approach unity. Then, the retarded phase error is essentially unretarded, and the "retarded" phase error is simply the integral of the frequency error. Thus, the duty cycle for times greater than $T_2$ is simply the instantaneous duty cycle.

Simulation method 300 is significantly faster than conventional methods. The method 300 has been implemented in SpectreHDL™ (available form Cadence Design Systems). A conventional voltage model running on a SUN SPARC5 takes roughly 25 hours to simulate a particularly simple phase lock loop circuit 200 for the first 120 ms of its operation. The invention method 300 takes about 36 seconds for the same circuit 200.

Figure 7:
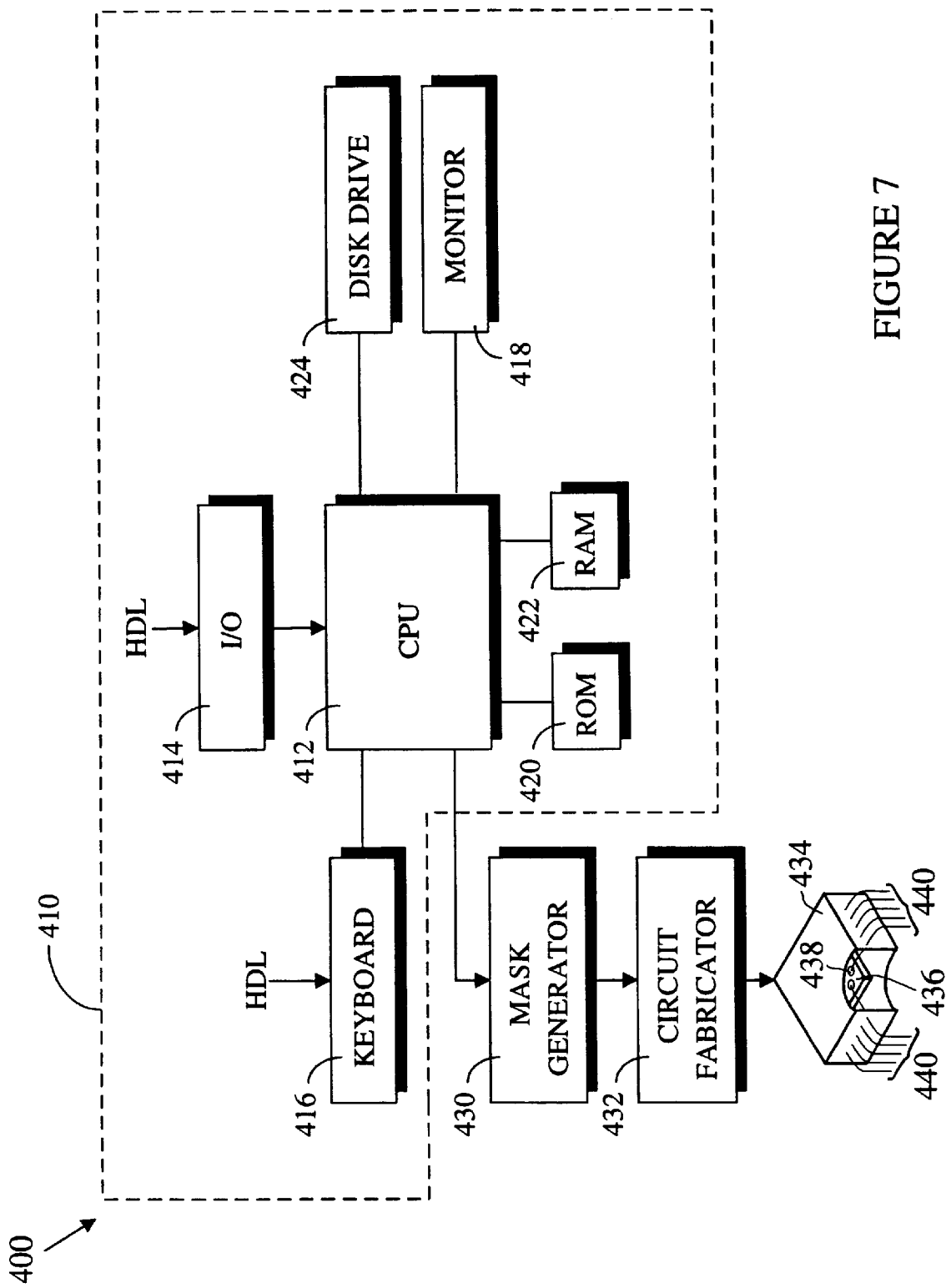
FIG. 7 is a block diagram of an embodiment of a system for making a phase loop circuit in accordance with the present invention.

FIG. 7 shows a system 400 for making a phase lock loop circuit 200 in accordance with the present invention. In preferred embodiments, simulation method 300 runs on the system 400 although the method 300 may run on other systems and computers. The system 400 includes a digital hardware description processor 410 and a mask generator 430. The digital hardware description processor 410 is an example of the computer on which the method 300 runs. The digital hardware description processor 410 includes a central processing unit (CPU) 412. Design specifications are input to the system 400 and processor 410 via an input/output port 414 or by a user via keyboard 416. In preferred embodiments, the design specifications will be in a hardware description language (HDL) such as SpectreHDL™. The design specifications may include a reference frequency, a voltage controlled oscillator (VCO) input voltage, a VCO load current, and a duty cycle. The user can view progress of the system and verify his/her inputs by viewing a monitor 418 coupled to the CPU 412. ROM 420, RAM 422, and a disk drive 424 are coupled to the CPU 412. Of course, another storage device such as a tape drive could be substituted for the disk drive 424. The CPU 412 creates candidate circuit topologies and associated mask data from the design specifications. Descriptions of the candidate topologies and the mask data are stored on digital storage coupled to the CPU 412, such as the RAM 422 or disk drive 424.

The processor 410 uses the simulation method 300 to determine candidate specifications for a proposed circuit and compares the candidate specifications against the design specifications for a phase lock loop circuit 200.

Software implementing method 300 on the system 400 turns the hardware description processor 410 into a loop filter input determiner. The software may be stored in ROM 420, RAM 422, or the disk drive 424. ROM 420, RAM 422, or the disk drive 424 containing the software is an example of computer readable medium including program instructions for the simulation method 300. The software may be input by the keyboard 416 or I/O port 414.

The simulation method 300 running on the system 400 has a resetter for resetting the phase error obtained from the frequency error. The resetter shifts the phase error by a reset phase level when the phase error is approximately the same as a multiple of the reset threshold.

The mask generator 430 generates circuit mask for the phase lock loop circuit 200 using the associated mask data. A circuit fabricator 432 uses the circuit mask to make a phase lock loop circuit 200. As depicted in FIG. 7, the circuit fabricator 432 makes an integrated circuit 434. The mask may be appropriate for making a printed circuit or an integrated circuit. In either case, photolithography can use the mask to form lead traces on a printed circuit board or substrate 436. The integrated circuit 434 has input/output (I/O) pads 438 on the substrate 436. Leads 440 permit connecting the integrated circuit 434 containing the phase lock loop 200 to external circuitry (not shown).

While this invention has been described in terms of several preferred embodiments, it is contemplated that alterations, modifications and permutations thereof will become apparent to those skilled in the art upon a reading of the specification and study of the drawings. For example, the method may run on other computers than the specific computers and systems disclosed. Also, the specific form of the reset level, unlocked average duty cycle, weighting function, integrand weighting factor, and loop filter input may differ from the specific examples above. In addition, some hardware description languages may simplify the implementation of the simulation method and resetting integral. Quantities depending upon a ratio of the reference frequency variable to the VCO frequency variable could be rewritten to depend upon a ratio of the VCO frequency variable to the reference frequency variable. The invention method may be used to make phase lock loops in circuits other than those on integrated circuits. Furthermore, certain terminology has been used for the purposes of descriptive clarity, and not to limit the present invention. It is therefore intended that the following appended claims include all such alterations, modifications, and permutations as fall within the true spirit and scope of the present invention.

What is claimed is:

1. The computer-implemented method for simulating a phase-locked loop circuit, comprising the steps of:

modeling a phase-frequency detector in a phase domain as a resettable integrator;

generating a simulated local frequency source signal;

generating a frequency error by comparing a reference frequency of said simulated local frequency source signal with an input signal frequency of an input signal;

causing said resettable integrator to integrate said frequency error to obtain a duty cycle;

resetting said resettable integrator to a reset point when an output of said resettable integrator reaches a reset threshold level; and generating a loop filter input signal from the output of said resettable integrator.

2. The computer-implemented method of claim 1, further comprising the steps of:

filtering said loop filter input signal, thereby generating a loop filter output signal; and adjusting said simulated local frequency source signal in response to said loop filter output signal;

wherein said step of generating said loop filter input signal from the output of said resettable integrator comprises the steps of generating an unlocked duty cycle from the output of said resettable integrator, and transforming said unlocked duty cycle to an average current value dependent upon a magnitude of said frequency error.

3. The computer-implemented method of claim 2, wherein said unlocked duty cycle is related to said frequency error.

4. The computer-implemented method claim 2, wherein said step of generating said loop filter input signal from the output of said resettable integrator further comprises the step of generating an unlocked average duty cycle of said phase-frequency detector, and combining said unlocked average duty cycle of said phase-frequency detector with said unlocked duty cycle from the output of said resettable integrator with a weighting dependent upon the magnitude of said frequency error.

5. The computer-implemented method of claim 1, wherein said reset threshold level is a multiple of $2\pi$.

6. The computer-implemented method of claim 1, wherein said reset point is determined by a reset function that approaches $\pm 2\pi$ as said frequency error grows very large in magnitude, and approaches zero as said frequency error approaches zero.

7. The computer-implemented method of claim 1, further comprising the step of retarding the output of said resettable integrator when said frequency error is large.

8. The computer-implemented method of claim 7, wherein said step of retarding the output of said resettable integrator when said frequency error is large comprises the step of adjusting said frequency error during integration by a weighting factor.

9. The computer-implemented method of claim 8, wherein said weighting factor comprises a function of a ratio of said reference frequency of said simulated local frequency source signal and said input signal frequency.

10. The computer-implemented method of claim 9, wherein said weighting factor approaches unity as said frequency error becomes large, and approaches zero as said frequency error becomes small.

11. The computer-implemented method of claim 6, wherein said weighting factor determines how quickly said resettable integrator becomes responsive to a reduction in said frequency error.

12. The computer-implemented method of claim 1, wherein the output of said resettable integrator comprises a multi-valued sawtooth waveform when said frequency error is small.

13. The computer-implemented method of claim 12, wherein said duty cycle is related to a normalized frequency error when said frequency error is large, and to a phase error when said frequency error is small.

14. The computer-implemented method of claim 13, wherein the output of said resettable integrator tracks said phase error when said frequency error is small.

15. The computer-implemented method of claim 1, wherein said loop filter input signal is derived according to the following formula:

$$\text{loop filter input} = [(k \cdot H) + (1-k) \cdot \S_R(1-k)(f_{ERROR}/2\pi)] \cdot i_{MAX},$$

wherein "k" represents a weighting function, "H" represents an unlocked average duty cycle of said phase-frequency detector, "$i_{max}$" represents a maximum charge pump current of said phase-frequency detector, "$f_{ERROR}$" represents said frequency error, and "$\S_R$" represents a non-linear integration operation whereby said resettable integrator is reset to said reset point when the output of said resettable integrator reaches said reset threshold level.

16. A system for simulating a phase-locked loop, comprising:

a storage device, said storage device storing a computer file containing design specifications for an electrical circuit design including a phase-locked loop circuit, said phase-locked circuit comprising a local frequency source signal, an input signal, and a resettable integrator for modeling a phase-frequency detector in a phase domain; and a processor configured to execute programming instructions for simulating operation of said phase locked loop circuit, said programming instructions causing said processor to generate a simulated frequency error by comparing a reference frequency of said local frequency source signal with an input signal frequency of said input signal, to integrate said frequency error using said resettable integrator to obtain a duty cycle, to reset said resettable integrator to a reset point when an output of said resettable integrator reaches a reset threshold level, and to generate a loop filter input signal from the output of said resettable integrator.

17. The system of claim 16, wherein said programming instructions further cause said processor to filter said loop filter input signal, thereby generating a loop filter output signal, and adjust said local frequency source signal in response to said loop filter output signal;

wherein said processor generates said loop filter input signal by generating an unlocked duty cycle from the output of said resettable integrator and transforms said unlocked duty cycle to an average current value dependent upon a magnitude of said frequency error.

18. The system of claim 17, wherein said unlocked duty cycle is related to said frequency error.

19. The system of claim 17, wherein said processor generates said loop filter input signal by generating an unlocked average duty cycle of said phase-frequency detector, and combining said unlocked average duty cycle of said phase-frequency detector with said unlocked duty cycle from the output of said resettable integrator with a weighting dependent upon the magnitude of said frequency error.

20. The system of claim 16, wherein said reset threshold level is a multiple of $2\pi$.

21. The system of claim 16, wherein said programming instructions cause said processor to determine said reset point using a reset function that approaches $\pm 2\pi$ as said frequency error grows very large in magnitude, and approaches zero as said frequency error approaches zero.

22. The system of claim 16, wherein said programming instructions further cause said processor to retard the output of said resettable integrator when said frequency error is large.

23. The system of claim 22, wherein said processor retards the output of said resettable integrator by adjusting said frequency error during integration by a weighting factor.

24. The system of claim 23, wherein said weighting factor comprises a function of a ratio of said reference frequency of said local frequency source signal and said input signal frequency.

25. The system of claim 24, wherein said weighting factor approaches unity as said frequency error becomes large, and approaches zero as said frequency error becomes small.

26. The system of claim 23, wherein said weighting factor determines how quickly said resettable integrator becomes responsive to a reduction in said frequency error.

27. The system of claim 16, wherein the output of said resettable integrator comprises a multi-valued sawtooth waveform when said frequency error is small.

28. The system of claim 27, wherein said duty cycle is related to a normalized frequency error when said frequency error is large, and to a phase error when said frequency error is small.

29. The system of claim 16, wherein the output of said resettable integrator tracks said phase error when said frequency error is small.

30. The system of claim 16, wherein said processor derives said loop filter input signal according to the following formula:

loop filter input=$[(k \cdot H)+(1-k) \cdot \S_R(1-k)(f_{ERROR}/2\pi)] \cdot i_{MAX}$, wherein "k" represents a weighting function, "H" represents an unlocked average duty cycle of said phase-frequency detector, "$i_{max}$" represents a maximum charge pump current of said phase-frequency detector, "$f_{ERROR}$" represents said frequency error, and "$\S_R$" represents a non-linear integration operation whereby said resettable integrator is reset to said reset point when the output of said resettable integrator reaches said reset threshold level.

31. A computer program embodied in a tangible medium capable of being read by a computer, said computer program comprising instructions causing one or more processors to perform a series of steps for simulating a phase-locked loop circuit, said steps comprising:

modeling a phase-frequency detector in a phase domain as a resettable integrator;

generating a simulated local frequency source signal;

generating a frequency error by comparing a reference frequency of said simulated local frequency source signal with an input signal frequency of an input signal;

causing said resettable integrator to integrate said frequency error to obtain a duty cycle;

resetting said resettable integrator to a reset point when an output of said resettable integrator reaches a reset threshold level; and generating a loop filter input signal from the output of said resettable integrator.

32. The computer program of claim 31, wherein instructions further cause the one or more processors to perform the steps of:

filtering said loop filter input signal, thereby generating a loop filter output signal; and adjusting said simulated local frequency source signal in response to said loop filter output signal;

wherein said step of generating said loop filter input signal from the output of said resettable integrator comprises the steps of generating an unlocked duty cycle from the output of said resettable integrator, and transforming said unlocked duty cycle to an average current value dependent upon a magnitude of said frequency error.

33. The computer program of claim 32, wherein said unlocked duty cycle is related to said frequency error.

34. The computer-implemented method of claim 32, wherein said step of generating said loop filter input signal from the output of said resettable integrator further comprises the step of generating an unlocked average duty cycle of said phase-frequency detector, and combining said unlocked average duty cycle of said phase-frequency detector with said unlocked duty cycle from the output of said resettable integrator with a weighting dependent upon the magnitude of said frequency error.

35. The computer program of claim 31, wherein said reset threshold level is a multiple of $2\pi$.

36. The computer program of claim 31, wherein said one or more processors determine said reset point using a reset function that approaches $\pm 2\pi$ as said frequency error grows very large in magnitude, and approaches zero as said frequency error approaches zero.

37. The computer program of claim 31, wherein said instructions cause said one or more processors to further perform the step of retarding the output of said resettable integrator when said frequency error is large.

38. The computer program of claim 37, wherein said step of retarding the output of said resettable integrator when said frequency error is large comprises the step of adjusting said frequency error during integration by a weighting factor.

39. The computer program of claim 38, wherein said weighting factor comprises a function of a ratio of said reference frequency of said simulated local frequency source signal and said input signal frequency.

40. The computer program of claim 39, wherein said weighting factor approaches unity as said frequency error becomes large, and approaches zero as said frequency error becomes small.

41. The computer program of claim 38, wherein said weighting factor determines how quickly said resettable integrator becomes responsive to a reduction in said frequency error.

42. The computer program of claim 31, wherein the output of said resettable integrator comprises a multi-valued sawtooth waveform when said frequency error is small.

43. The computer program of claim 42, wherein said duty cycle is related to a normalized frequency error when said frequency error is large, and to a phase error when said frequency error is small.

44. The computer program of claim 31, wherein the output of said resettable integrator tracks said phase error when said frequency error is small.

45. The computer program of claim 31, wherein said instructions cause the one or more processors to derive the loop filter input signal according to the following formula:

loop filter input=$[(k \cdot H)+(1-k) \cdot \S_R(1-k)(f_{ERROR}/2\pi)] \cdot i_{MAX}$, wherein "k" represents a weighting function, "H" represents an unlocked average duty cycle of said phase-frequency detector, "$i_{max}$" represents a maximum charge pump current of said phase-frequency detector, "$f_{ERROR}$" represents said frequency error, and "$\S_R$" represents a non-linear integration operation whereby said resettable integrator is reset to said reset point when the output of said resettable integrator reaches said reset threshold level.

46. The computer program of claim 31, wherein said phase-frequency detector has three states.

* * * * *